United States Patent [19]

Takahashi et al.

[11] 3,934,087

[45] Jan. 20, 1976

[54] ANGLE MODULATED WAVE DEMODULATION SYSTEM

[75] Inventors: Nobuaki Takahashi, Yamato; Yoshiki Iwasaki, Yokohama; Masao Kasuga, Sagamihara; Yasuo Itoh, Tokyo, all of Japan

[73] Assignee: Victor Company of Japan, Limited, Yokohama, Japan

[22] Filed: Oct. 4, 1973

[21] Appl. No.: 403,635

[30] Foreign Application Priority Data
Oct. 7, 1972  Japan............................. 47-100300
Oct. 9, 1972  Japan............................. 47-101451

[52] U.S. Cl.................... 179/100.4 ST; 179/15 BT; 179/100.1 TD; 329/103
[51] Int. Cl.²................................................ G11B 3/04
[58] Field of Search.......... 179/100.1 TD, 100.4 ST, 179/1 GQ, 15 BT; 329/122, 123, 124, 103; 325/419, 421; 331/23, 25

[56] References Cited
UNITED STATES PATENTS

| | | | |
|---|---|---|---|
| 2,378,819 | 6/1945 | Albright | 179/100.4 A |
| 3,111,625 | 11/1963 | Crafts | 329/122 |
| 3,209,271 | 9/1965 | Smith | 329/122 |
| 3,363,194 | 1/1968 | Hileman | 331/25 |
| 3,371,281 | 2/1968 | Powell | 329/122 |
| 3,564,434 | 2/1971 | Camenzind et al. | 329/122 |
| 3,594,651 | 7/1971 | Wolejsza, Jr. | 325/419 |
| 3,621,399 | 11/1971 | Rabow et al. | 325/419 |
| 3,678,397 | 7/1972 | Dann | 325/421 |
| 3,686,471 | 8/1972 | Takahashi | 179/100.4 ST |

Primary Examiner—Stanley M. Urynowicz, Jr.
Assistant Examiner—David K. Moore

[57] ABSTRACT

A system for demodulating angle modulated waves comprises a phase locked loop including a phase comparator and a voltage controlled oscillator. An attenuation means is inserted into the phase locked loop. This attenuation means does not affect the DC component of an input angle modulated wave, but does cause an attenuation with respect to an AC component, to cause a decrease in the loop gain. The phase locked loop has a DC lock range exhibiting a relatively wide lock range width even when the input level is relatively low and an AC lock range produced by the attenuation circuit and exhibiting a relatively narrow lock range width when the input level is relatively low. The attenuation means detects an abnormality in the angle modulated wave, the harmonics component of the direct wave, and the like. A variable attenuation circuit controlled by the output of the detecting means is varied in its attenuation quantity.

4 Claims, 19 Drawing Figures

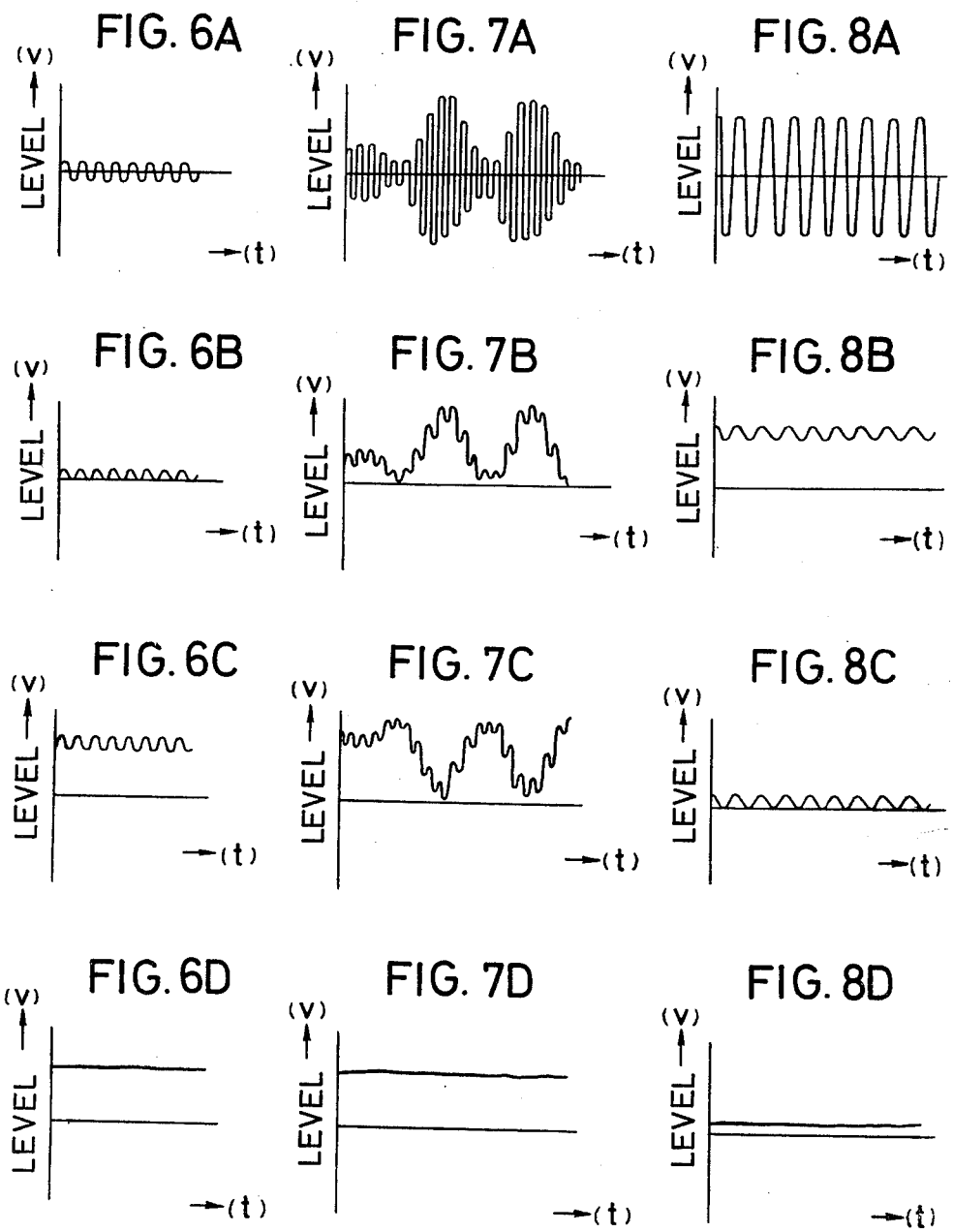

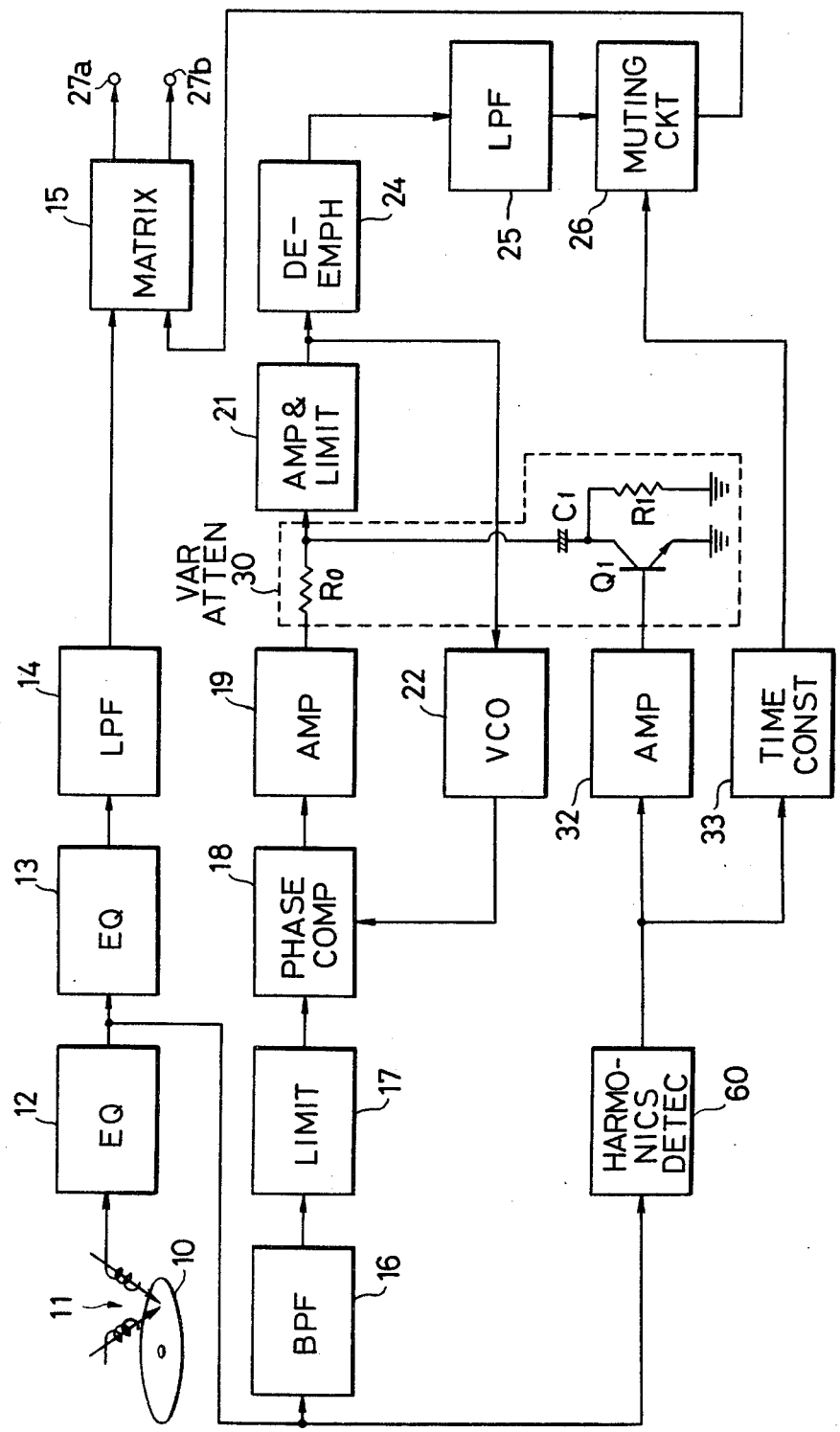

ANGLE MODULATED WAVE DEMODULATION SYSTEM

BACKGROUND OF THE INVENTION

This invention relates to an angle modulated wave demodulation system, and more particularly to a system for controlling the lock range of a phase locked loop for demodulating an angle modulated wave reproduced from a multichannel disc.

A "phase locked loop" is a filter and demodulator combination using a voltage controlled oscillator. The center frequency of the phase locked loop is determined by the free-running frequency of the voltage controlled oscillator. The "lock range" or tracking range is the range of frequencies on either side of the center frequency which may be produced by the voltage controlled oscillator while it remains locked on the center frequency.

In general, a record disc of a discrete four-channel system carries direct waves comprised of sum signals derived from each of two channels and angle modulated waves resulting from the angle modulation of a carrier wave of 30 KHz by difference signals derived from each of two channels. These signals are superimposed and recorded on the two walls of the disc sound groove, as disclosed in detail in U.S. Pat. No. 3,686,471 entitled "SYSTEM FOR RECORDING AND/OR REPRODUCING FOUR CHANNEL SIGNALS ON A RECORD DISC".

In some cases, an absence of a signal or an abrupt decrease in the level of a signal may be picked up by a phonograph pick-up stylus. This occurs, for example, when a pick-up stylus rides over a particle of dust in a groove of a record disc. Sometimes the pick-up fails to completely trace on walls of the groove. Other times a part of the groove is damaged and part of the waveform is lacking from the groove. If the waveform on the groove is fine and complicated, the pick-up stylus jumps over it and fails to completely trace the waveform. Also, a reproduced part of the groove may be worn away due to repeated reproduction of the record disc, by a pick-up cartridge having a stylus tip with too large an equivalent mass, i.e., a large moment of inertia. As stated above, the frequency range of the angle modulated difference signal (20 KHz to 40 KHz) in the signal recorded on the groove is higher than the range of the direct wave sum signal. Accordingly, the part of the waveform having a relatively long and gradual groove wall curve relates to the direct wave sum signal. Another part of the waveform is relatively small and fine and relates to the angle modulated wave difference signal. Therefore, the absence of a signal or the drop in the level in the reproduced signal usually occurs in the angle modulated wave difference signal.

In the absence of a signal or the drop in the level, the frequency of the carrier component in the angle modulated wave difference signal abruptly deviates to a substantially very low frequency. Accordingly, noise is generated in an angle demodulator in a later stage responsive to the abrupt deviation of the carrier wave to a low frequency.

The abrupt decrease in the angle modulated wave and the resulting generation of noise is a characteristic of reproduction of the multichannel record disc. It is essentially different from a noise generation which generally occurs in FM communication, etc. In FM communication the carrier is always maintained at a constant level and a noise signal is added thereto with a result that the level as a whole increases rather than decreases. Furthermore, responsive to fading, the change in the level of an angle modulated wave is gradual and not abrupt. Whereas in the multi-channel record disc, it is inevitable that the level of the angle modulated wave decreases abruptly, due to the relationship between the tip of the stylus and the groove, existence of dust, damage of the groove and other causes.

When, the input carrier level is abnormally low, as mentioned above, the center frequency of the carrier oscillation frequency does not coincide in the voltage controlled oscillator and in the phase locked loop (PLL). This lack of coincidence results from a fluctuation in the rotational speed of a turntable of a record player or a variation in the temperature of the circuit. The PLL deviates from the locked state and generates beats of a frequency equal to the difference between the above mentioned oscillation frequency and the frequency of the input angle modulated carrier wave. Therefore normal demodulation is no longer carried out. These fluctuations are such that when there is a deviation in the turntable speed in the order of 3 percent or a fluctuation in the frequency of the voltage controlled oscillator or a temperature variation in the order of 3 percent, a frequency difference is produced in the order of 1.8 KHz with respect to a carrier frequency of 30 KHz of the input angle modulated difference signal.

As mentioned above, the PLL holds its locked state with respect to occurrences such as fluctuations in the turntable speed at the time of abnormal deterioration level. In order to prevent generation of beats as mentioned above, the applicant has previously proposed a novel multichannel disc demodulation system as disclosed in U.S. patent application Ser. No. 294,371, filed Oct. 2, 1972 now abandoned, entitled "ANGLE MODULATED WAVE DEMODULATION SYSTEM".

In a system according to our copending application Ser. No. 294,371, the time constant circuit 44 is provided at a position succeeding the phase comparator, as illustrated in FIG. 4 of that copending application. The time constant circuit 44 has a circuit, as there illustrated in FIG. 6.

In that FIG. 6, an input signal is applied to a left-side terminal and an output signal is derived from a right-side terminal. The output signal voltage V is represented by the following formula:

$$V = \frac{R_2 + \frac{1}{j2\pi f C_1}}{R_1 + R_2 + \frac{1}{j2\pi f C_1}} E \qquad (1)$$

where, E is the voltage of input signal.

The value of $1/(j2\pi f C_1)$ is inverse to the value of frequency $f$, which is a part of the denominator.

The value of capacitance $C_1$ is selected to obtain the following relationship:

$$\frac{1}{j2\pi f_1 C_1} << R_1, \quad \frac{1}{j2\pi f_1 C_1} << R_2$$

when the frequency $f_1$ is an audio frequency and $$\frac{1}{j2\pi f_2 C_1} >> R_1, \quad \frac{1}{j2\pi f_2 C_1} >> R_2$$

when the frequency $f_2$ is a much lower frequency (i.e., approaches a direct current).

Accordingly, for audio frequency components $f_1$, the formula (1) becomes $$V(f_1) = \frac{R_2}{R_1 + R_2} E(f_1)$$

and the output signal is attenuated to $R_2 / (R_1 + R_2)$ of the input signal.

On the other hand, for frequency components $f_2$ much lower than the audio frequencies, the equation (1) becomes $$V(f_2) = \frac{\frac{1}{j2\pi f_2 C_1} E(f_2)}{\frac{1}{j2\pi f_2 C_1}} E(f_2)$$

and, the output signal $V(f_2)$ substantially is equivalent to the input signal $E(f_2)$.

The lower frequency components in the output signal of the phase comparator occur when a turn-table of a record player rotates at a speed which deviates from the normal speed. When the central oscillation frequency of the voltage controlled oscillator deviates from the central frequency of the modulated wave, due to changes with respect to a lapse of time, the output signal level of the time constant circuit 44 becomes substantially equal to the level of the input signal. Therefore, the same result is obtained irrespective of the presence of the time constant circuit.

Accordingly, the DC lock range of the phase locked loop (the lock range with respect to the lower frequency components) does not relate to the existence or non-existence of the time constant circuit.

The level of the output signal from the time constant circuit becomes smaller than that of the input signal, with respect to the audio frequency components out of the output signal of the phase comparator. The lock range (AC lock range) of the phase locked loop, with respect to the audio frequency components becomes more narrow than the DC lock range.

While this proposed system of U.S. patent application Ser. No. 294,371 obtains a narrow AC lock range, it is accompanied by a problem in that the DC lock range cannot be widened any further. Accordingly, in order to obtain a large ratio of the DC lock range and the AC lock range (hereinafter referred to simply as "lock range ratio"), the AC lock range must be made small since the DC lock range is constant and cannot be made greater than a certain value. However, this measure is not desirable owing to the following point.

When the level of the angle modulated difference signal is high, and any harmonics component of the direct wave sum signal coming into the band of the former signal can be neglected, it is necessary to carry out demodulation with an enlarge lock range of the PLL. On the other hand, when there is a high level of noise due to causes such as wear of the disc sound groove, or when there is much disturbance due to causes such as the harmonics component of the direct wave sum signal, it is necessary to carry out demodulation with a small PLL lock range. For this reason, it is desirable that the above mentioned lock range ratio be large. That is, when the quality of the reproduced angle modulated difference signal is good the PLL lock range is expanded to carry out demodulation with a wide band and with high fidelity. When the quality is poor, the PLL lock range is made narrow to demodulate the signal of only a specific frequency range.

If the above mentioned lock range ratio has a large value (for example, approximately 10:1), the maximum value of the AC lock range will also become small in the above mentioned proposed system, and high-fidelity demodulation cannot be accomplished. This has heretofore been a problem.

Furthermore, in another example of the practice of the system of the above mentioned patent application, the AC lock range is fixed while the DC lock range is made large by maintaining the conversion gain of a voltage controlled oscillator in the PLL at a large DC value and at a small AC value (not especially large), thereby to attain a large lock range ratio.

By the practice of this example, however, if the lock range becomes excessively large, the PLL will be erroneous locked even by a signal of the sum signal band (less than 15 KHz). In this case, a signal within the sum signal band below 15 KHz will be demodulated as a disturbance wave. The demodulation output signal will become a signal containing a noise component in addition to the desired demodulated difference signal.

The following principal conditions are desirable for the demodulation of an angle modulated wave signal picked up from a multichannel disc and used in a system with a PLL.

1. The use of a large lock range ratio, for example, of the order of from 10:1 to 30:1.
2. The use of a maximum AC lock range of large value, for example, of the order of ± 10 KHz.
3. The use of a maximum DC lock range of suitable size, which, moreover, does not reach an unnecessary band (below 15 KHz). For this, the ideal lock range is of the order of from $(30 - 14)$ KHz to $(30 + 29)$ KHz. However, in actual practice, there is no problem if this range is from $(30 + 19)$ KHz to $(30 + 59)$ KHz.

SUMMARY OF THE INVENTION

Accordingly, it is a general object of the present invention to provide a new and useful angle modulated wave demodulation system wherein the problems of the above mentioned proposed system are solved and the above enumerated requirements are satisfied.

A specific object of the invention is to provide a demodulation system for angle modulated waves. Here an object is to provide such a system which is capable of accomplishing excellent demodulation without the generation of noise by diminishing, when necessary, the lock range of a PLL for demodulating angle modulated waves.

Another object of the invention is to provide a system for demodulating angle modulated waves, which system is capable of reducing the AC lock range of a PLL, when necessary, thereby to enlarge the ratio of the DC lock range and the AC lock range thereof.

Still another object of the invention is to provide a system for demodulating an input angle modulated wave by detecting a low level of the angle modulated wave or the large level of the amplitude modulated component and thereby effecting a control to diminish the lock range of a PLL.

A further object of the invention is to provide a system for demodulating an angle modulated wave by detecting the harmonics of a direct wave component within a signal reproduced from a multichannel disc and thereby diminishing the AC lock range of a PLL.

A still further object of the invention is to provide a system for demodulating an angle modulated wave by effecting a limitation, whereby the lower limit of the frequency range of the lock range of a PLL does not reach the frequency band of a direct wave on which the angle modulated wave is superimposed.

Other object and further features of the invention will be apparent from the following detailed description set forth with reference to the accompanying drawings.

BRIEF DESCRIPTION OF THE DRAWINGS

In the drawings:

FIGS. 6A through 6D are signal waveform charts, respectively, for a description of detection operations in the case where the level of an input angle modulated wave is low;

FIGS. 7A through 7D are signal waveform charts, respectively, for a description of detection operations when the fluctuation of the level of the input angle modulated wave is large;

FIGS. 8A through 8D are signal waveform charts, respectively, for a description of the detection operations when the level of the input angle modulated wave is normal;

FIG. 10 is a block diagram indicating the essential organization of a third embodiment of a demodulation system, according to the invention.

DETAILED DESCRIPTION

Figure 1:
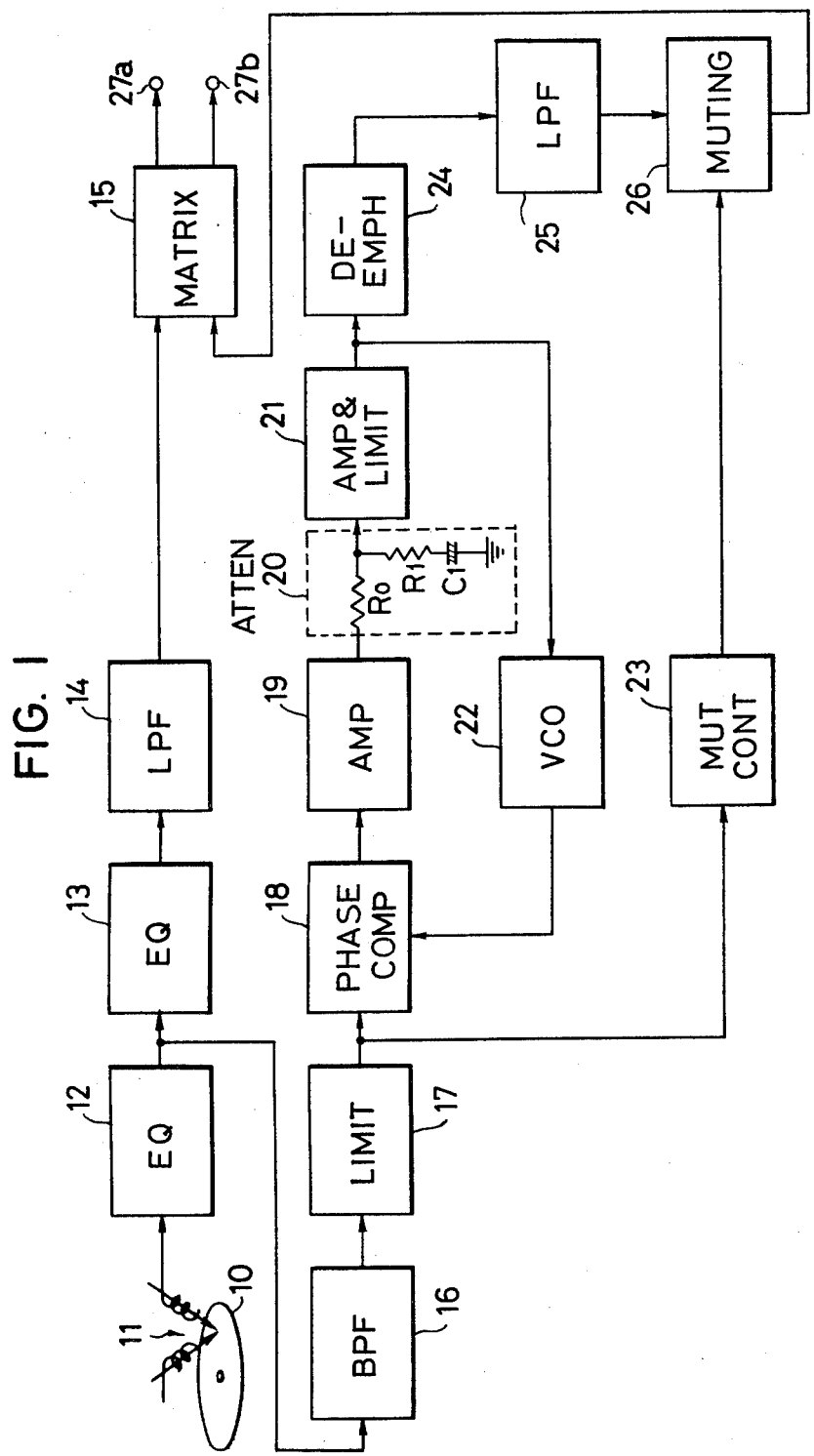
FIG. 1 is a block diagram indicating the essential organization of one embodiment of an angle modulated wave demodulation system, according to the invention.

Referring first to FIG. 1, the first embodiment of the angle modulated wave demodulation system, according to the invention, will be described.

A four-channel record disc 10 is recorded with signals derived from a total of four channels, in accordance with the recording system which has been previously proposed. That is, recorded on each wall of the sound groove is a multiplexed signal of a direct wave sum signal and an angle modulated wave difference signal derived from the signals of two channels. Of the signals picked up by a pickup cartridge 11 from this groove of the disc 10, the multiplexed signal made up from the direct wave sum signal and the angle modulated wave difference signal related to the signals of two channels are reproduced from the right wall of the groove. This picked up signal is supplied to an equalizer 12 of ½ RIAA characteristic and thereby equalized.

This reproduced signal is supplied, on one hand, by way of an equalizer 13 of 2/2 RIAA characteristic to a low-pass filter 14, where the angle modulated wave component is removed. Only the direct wave sum signal component is derived and is then supplied to a matrix circuit 15.

The output of the equalizer 12 is supplied, on the other hand, to a band-pass filter 16 having a filtration band of from 20 KHz to 40 KHz, where the angle modulated wave difference signal component is derived. This signal is then supplied through a limiter 17 to a phase comparator (phase detector) 18 and a muting control circuit 23. This muting control circuit 23 detects the presence or absence of an angle modulated wave component and, accordingly, it controls a muting circuit 26.

The phase comparator 18, together with an amplifier 19, a voltage controlled oscillator 22, and other parts, constitutes a phase locked loop (PLL). The phase comparator 18 carries out a phase comparison of the input angle modulated wave and an output oscillation wave from the voltage controlled oscillator 22. Comparator 18 generates an error voltage in accordance with the resulting phase difference. The output signal of this phase comparator 18 is amplified by the amplifier 19 and is then supplied through an attenuation circuit 20, comprising resistors R0 and R1 and a capacitor Cl, to an amplifier and limiter 21.

The attenuation circuit 20 and the amplifier and limiter 21 are essential and vital parts in the system of the present invention, and are described more fully hereinafter.

A demodulated difference signal component is produced as an output by the amplifier and limiter 21. This output is supplied, on one hand, through a de-emphasis circuit 24, a low-pass filter 25, and the above mentioned muting circuit 26 to the matrix circuit 15, where it is matrixed with the sum signal component from the low-pass filter 14. As a result, channel signals such as, for example, left front (first) and left rear (second) signals, are obtained at output terminals 27a and 27b of the matrix circuit 15.

The output signal of the amplifier and limiter 21 is supplied, on the other hand, to the voltage controlled oscillator 22 as a control voltage for controlling the output oscillation frequency thereof. The voltage controlled oscillator 22 has a free-running oscillation at a frequency equal to the carrier wave frequency (30 KHz in the instant embodiment). This carrier frequency is used for angle modulating the difference signal in the recording system when there is no input at the phase comparator 18, from the limiter 17, or when the PLL becomes unlocked. Furthermore, the voltage controlled oscillator 22 is controlled by a voltage from the above mentioned amplifier and limiter 21. Thus, its output oscillation frequency is equal to the input angle modulated frequency from the limiter 17 to the phase comparator 18. Accordingly, the voltage obtained from the amplifier and limiter 21 (i.e., the input voltage to the voltage controlled oscillator 22) is a voltage corresponding to the frequency deviation of the angle modulated wave supplied to the phase comparator 18. Therefore, a demodulated output of the angle modulated wave is obtained from the PLL.

While FIG. 1 illustrates only the circuit system (the left channel system in the groove of the disc 10) relating to the signals of the first and second channels, an identical circuit system is provided also for the third (right front) and fourth (right rear) channels. Therefore, a detailed description of this circuit system will not be repeated.

Figure 2:
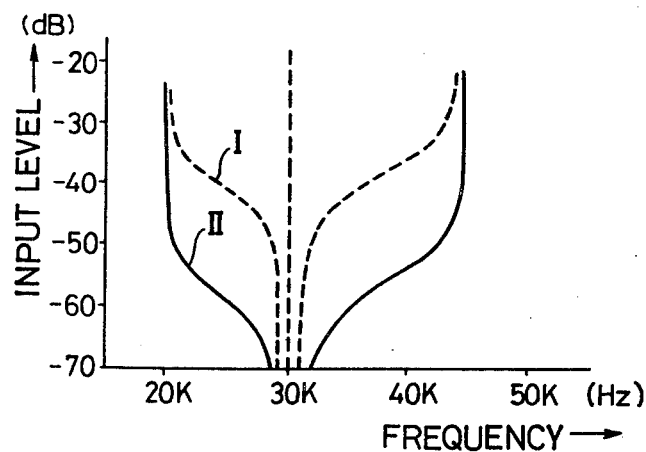
FIG. 2 is a graphical representation indicating the lock ranges of a PLL in the system illustrated in FIG. 1.

The above mentioned PLL has a DC range of a characteristic determined by the gain of the entire loop, that is, the loop gain, and indicated by the curve II in FIG. 2. This DC lock range characteristic is not influenced by the existence or nonexistence of the attenuation circuit 20. The capacitance value of the capacitor C1 is selected at an amply high value to prevent the attenuation characteristic from undergoing change due to frequency.

As for the AC lock range characteristic, the loop gain becomes small as a result of the attenuation circuit 20, and, at the same time, the width of the maximum lock range is expanded by the amplifier 21, whereby the AC lock range characteristic becomes as indicated by the dotted-line curve I in FIG. 2. As is apparent from a comparison of the curves II and I in FIG. 2, there is a difference of 20 dB in input level, that is, a difference of 10 times, in obtaining the same DC lock range and the AC lock range. Therefore, the lock range ratio is 10:1 in the illustrated example.

As is apparent from the AC lock range characteristic curve I, when the reproduced angle modulated wave is good, and the level of the input angle modulated wave is high, the PLL demodulates with a large lock range width, and reproduction is carried out with high fidelity. On one hand, as mentioned hereinbefore, if the level of the input angle modulated wave drops abruptly because of damage defect in the disc, dust, or some other abnormality, the lock range width of the PLL becomes narrow. The PLL easily becomes unlocked, and reproduction of the noise component is prevented. Furthermore, as indicated by the characteristic curve II, the DC lock range width is large up to the range wherein the input level is low. For this reason, the AC lock range can change within this width. Even if the carrier frequency fluctuates as a result of a deviation in the turntable speed, variation in the circuit temperature, or some similar reason as mentioned hereinbefore, this will have no adverse effect.

The amplifier and limiter 21 accomplishes the function of amplification. At the same time, it also accomplishes the restriction of the portion above a specific voltage of the input signal to carry out limiting and to hold the output below a specific voltage value. The output voltage of the amplifier in the amplifier and limiter 21 increases when the deviation frequency of the input angle modulated difference signal decreases. Accordingly, the limiter limits the voltage level above a specific voltage. As a result, the lower portion of the deviation frequency of the lock range characteristic is restricted and does not become less than a predetermined frequency.

The limiter in the amplifier and limiter 21 limits the voltage level with respect to voltages below a predetermined voltage if the output voltage of the amplifier in the amplifier and limiter 21 decreases when the deviation frequency of the input angle modulated difference signal decreases.

In the present embodiment, the limiting value of the amplifier and limiter 21 is so selected that the lock range characteristic will not become less than 20 KHz. Accordingly, the lock range characteristic curves I and II extend up to a frequency in the order of 45 KHz on the side higher than 30 KHz but are held at 20 KHz on the side lower than 30 KHz. The lock range characteristics does not extend to a frequency lower than 20 KHz. These curves are asymmetrical with respect to 30 KHz.

Since the lock range characteristic does not extend below 20 KHz as mentioned above, there is no erroneous locking of the PLL and no generation of noise due to the direct wave sum signal component picked up together with the angle modulated wave difference signal.

For the resistor R1 in the above mentioned attenuation circuit 20, a variable resistor may be used instead of a fixed resistor, whereby its resistance value can be suitably varied and set.

Figure 3:
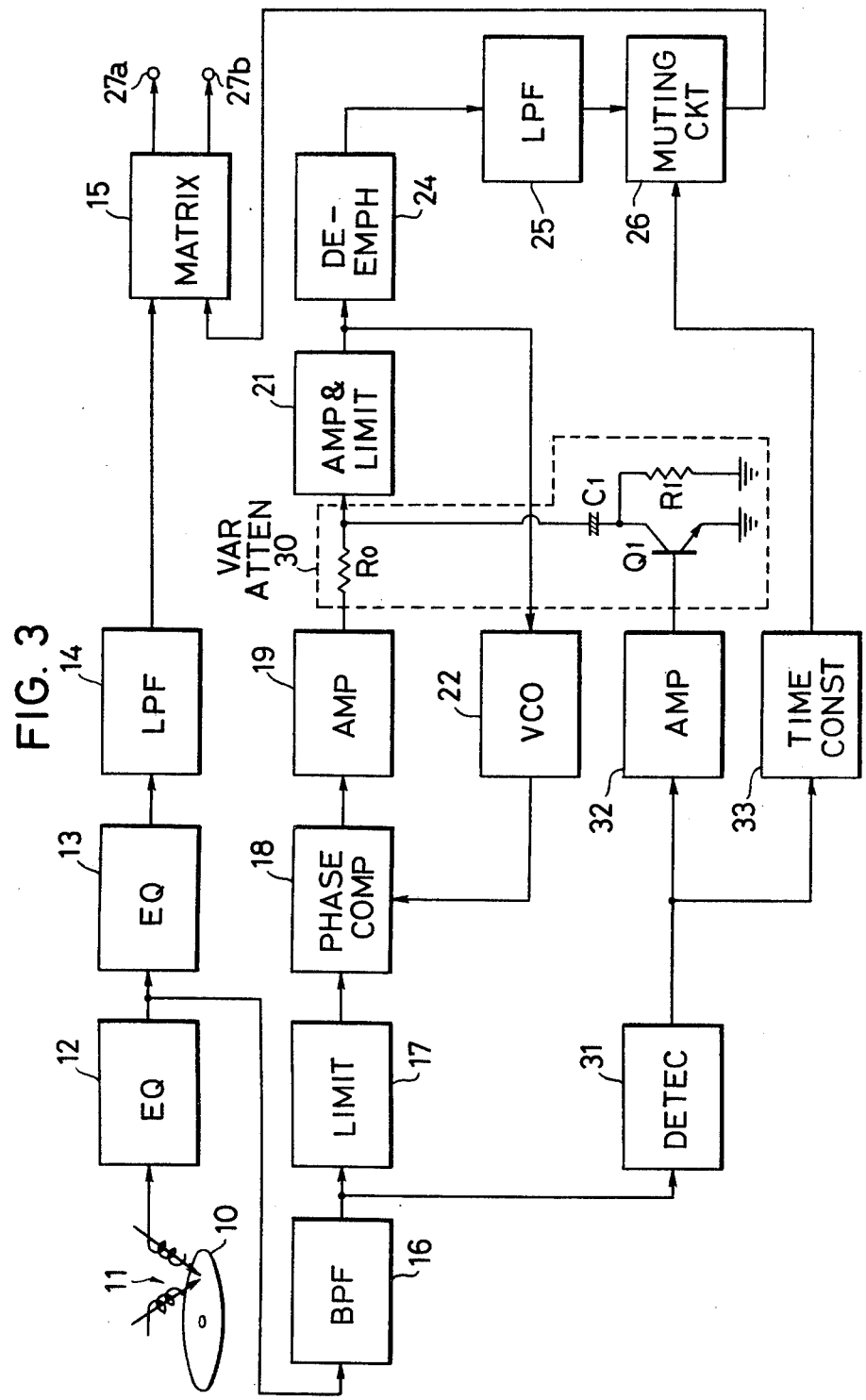
FIG. 3 is a block diagram indicating the essential organization of a second embodiment of a demodulation system, according to the invention.

Next, the second embodiment of the demodulation system of the invention will be described in conjunction with FIG. 3. In FIG. 3, parts which are the same as or equivalent to parts in FIG. 1 are designated by like reference numerals and characters, and a detailed description of such parts will not be repeated.

In this second embodiment, abnormalities in the input angle modulated wave are detected by a detector 31. A variable attenuation circuit 30 is thereby controlled.

One embodiment of this system will be described with respect to the detector 31, used as a carrier level detector. An angle modulated wave signal which has been filtered by a band-pass filter 16, similarly as in the preceding embodiment, is supplied, on one hand, by way of a limiter 17 to a phase comparator of a PLL and, on the other hand, to the detector 31.

Then, if the level of the angle modulated wave drops abruptly, the detector 31 detects this level drop and produces a corresponding output signal. This output signal of the detector 31 is amplified by an amplifier 32 and then applied to the base of a transistor Q1 of the above mentioned variable attenuation circuit 30. The resistance value of this transistor Q1 is connected in parallel with a resistor R1. This resistance value decreases as the voltage applied to its base becomes high. As a resultant effect, the parallel resistance component of the resistor R1 and the transistor Q1 becomes small. The loop gain of the PLL decreases.

Consequently, the AC lock range characteristic I of the PLL moves upward relative to the DC lock range characteristic II in FIG. 2 in accordance with the degree of level attenuation of the input angle modulated wave. Therefore, the optimum AC lock range can be obtained in accordance with the level of the input angle modulated wave.

On the other hand, the output of the detector 31 is also supplied by way of a time constant circuit 33 to the muting circuit 26. The output controls this muting circuit so that it will not pass the output of the low-pass filter 25 when the level of the input angle modulated wave drops abruptly.

Figure 4:
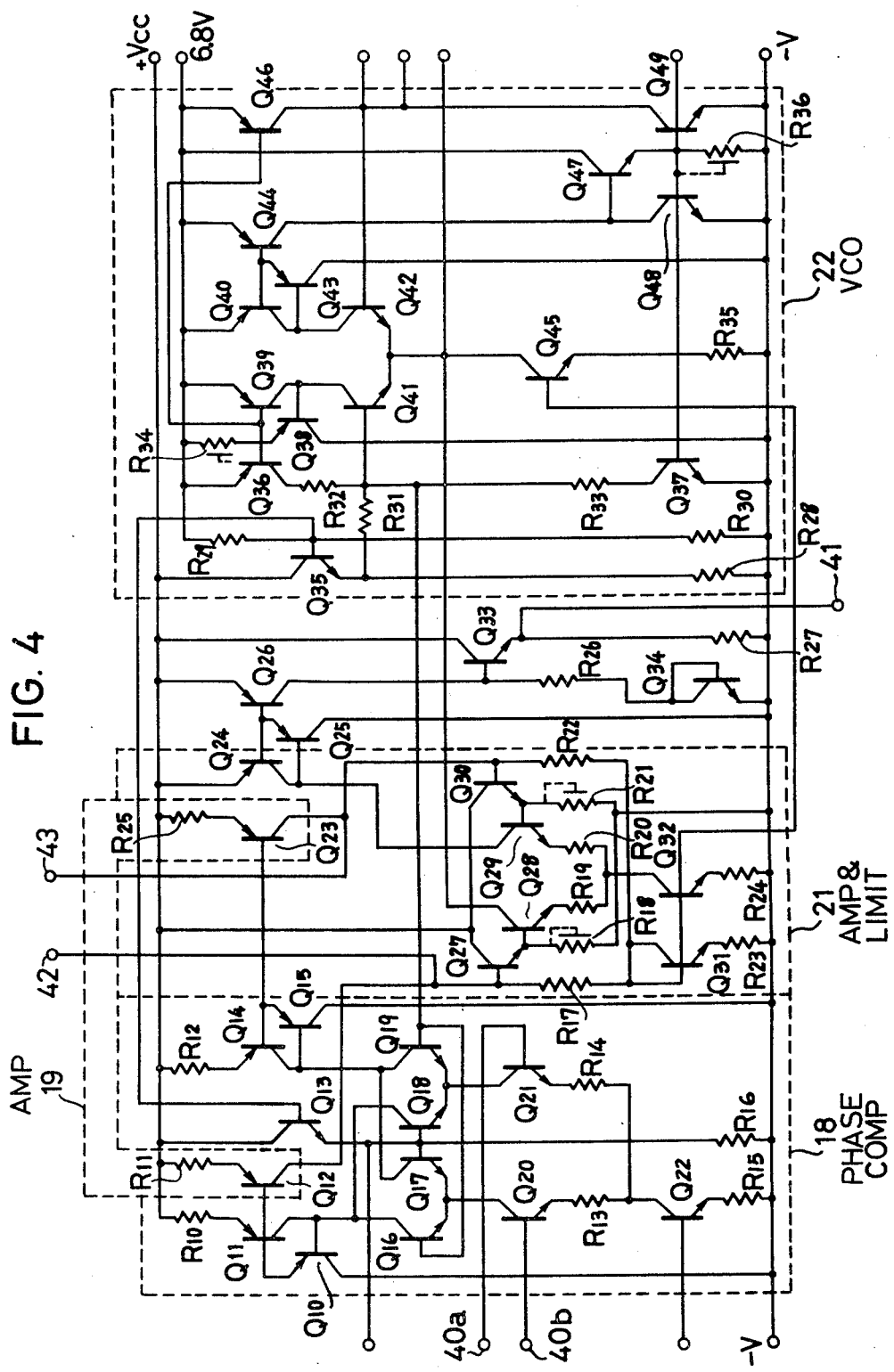
FIG. 4 is a circuit diagram of one embodiment of a specific circuit of a PLL section in the system illustrated in FIG. 3.

FIG. 4 shows one embodiment of a specific circuit for the PLL circuit, in the form of an IC (integrated circuit) using the block systems of FIGS. 1 and 3. The block circuit parts which are the same as or equivalent to those in FIGS. 1 and 3 are designated by like reference numerals.

The circuit comprising transistors Q12 and Q23 and resistors R11 and R25 constitutes the amplifier 19. The circuit comprising transistors Q11 and Q13 through Q22 and resistors R10 and R12 through R16 constitutes the phase comparator 18. The circuit comprising transistors Q27 through Q32 and resistors R17 through R24 constitutes the amplifier and limiter 21. The circuit comprising transistors Q35 through Q49 and resistors R28 through R36 constitute the voltage controlled oscillator 22. In the amplifier and limiter 21, the resistors R17 and R22 function as base biases for the transistors Q27 and Q30 and, at the same time, are resistors corresponding to the resistor R0 in the attenuation circuit 20 and the variable attenuation circuit 30. The amplifier and limiter 21 limit voltage when the transistors Q28 and Q29 become saturated.

The input angle modulated wave signal from the limiter 17 is supplied through input terminals 40a and 40b to the phase comparator 18. The demodulation output is derived from an output terminal 41. A circuit comprising the resistor R1 and the capacitor C1 or a circuit comprising the resistor R1, the capacitor C1, and the transistor Q1 is connected between terminals 42 and 43.

One example of resistance values of the above mentioned resistors is as follows.

| R10 | 1 KΩ    | R11 | 1 KΩ    |
|-----|---------|-----|---------|
| R12 | 1 KΩ    | R13 | 2 KΩ    |
| R14 | 2 KΩ    | R15 | 1.2 KΩ  |
| R16 | 4 KΩ    | R17 | 18 KΩ   |
| R18 | 75 KΩ   | R19 | 200 Ω   |
| R20 | 200 Ω   | R21 | 75 KΩ   |
| R22 | 18 KΩ   | R23 | 1.2 KΩ  |
| R24 | 1 KΩ    | R25 | 1 KΩ    |
| R26 | 15 KΩ   | R27 | 3.6 KΩ  |
| R28 | 4 KΩ    | R29 | 1.3 KΩ  |
| R30 | 4.7 KΩ  | R31 | 3 KΩ    |
| R32 | 20 KΩ   | R33 | 40 KΩ   |
| R34 | 10 KΩ   | R35 | 2.4 KΩ  |
| R36 | 10 KΩ   |     |         |

Next to be described is another embodiment of the detector 31 in the system shown by block diagram in FIG. 3. This is an arrangement of parts adapted to detect a drop in the level of the angle modulated wave. In addition, it detects any vibration fluctuation component thereof.

Figure 5:
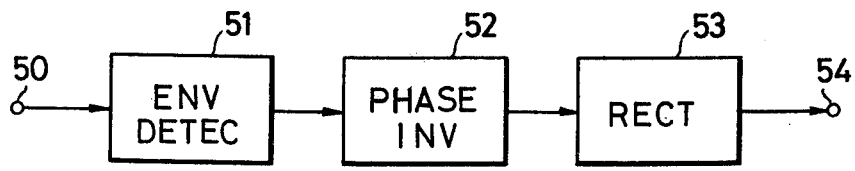
FIG. 5 is a block diagram of one embodiment of a part for detecting abnormalities in the system shown in FIG. 3.

A specific block organization of the detector 31 is shown in FIG. 5. An angle modulated wave from the band-pass filter 16 is supplied through an input terminal 50 to an envelope detector circuit 51, where it undergoes envelope detection. Accordingly, the output of the detector 51 becomes as indicated in FIGS. 6B, 7B, or 8B, respectively, in when the signal at the terminal 50 is of a very low level as indicated in FIG. 6A, when the amplitude variation is large as indicated in FIG. 7A, or when the level of the input angle modulated wave is normal.

The output signal of the envelope detector 51 is phase inverted by a phase inverter 52 and becomes a signal as indicated in FIG. 6C, 7C, or 8C, respectively, in correspondence with the above mentioned three cases. This phase inverted signal is rectified by a rectifying circuit 53, whereupon a control voltage as indicated in FIGS. 6D, 7D, or 8D is obtained at an output terminal 54, respectively, in correspondence with the above mentioned three cases. This control voltage is applied by way of the amplifier 32 to the base of the transistor Q1. Control of the AC lock range of the PLL is carried out similarly as described hereinbefore.

Accordingly, by using a detector 31 (FIG. 5), the following kinds of control voltages can be obtained. If the level of the angle modulated wave is normal as indicated in FIG. 8A, the control voltage is low as indicated in FIG. 8D. On one hand, if the level of the angle modulated wave is very low as indicated in FIG. 6A, and if the amplitude of the angle modulated wave is fluctuating and thereby has an amplitude modulation component as indicated in FIG. 7A, high control voltages are respectively obtained as indicated in FIGS. 6D and 7D.

In any abnormality in the angle modulated wave, as where the level of the wave drops abruptly or where there is an amplitude variation component, it is possible with a single detector 31 to detect that abnormality with a single detector 31.

Figure 9:
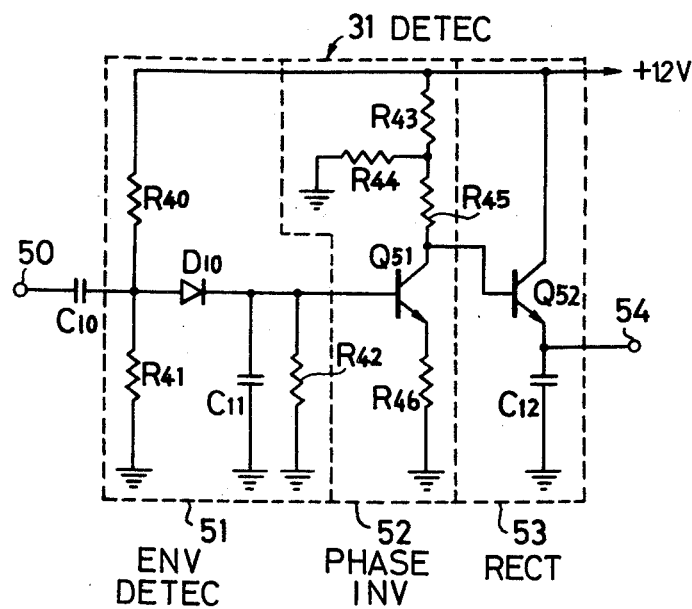
FIG. 9 is a circuit diagram of one embodiment of a specific circuit of the part for detecting abnormalities shown in FIG. 5.

One embodiment of a specific circuit of the system represented by block diagram in FIG. 5 is shown in FIG. 9. An angle modulated wave signal from the band-pass filter 16 is supplied by way of a coupling capacitor C10 to the detector circuit 51. Detector 51 comprises a diode D10 suitably biased by bias resistors R40 and R41, a capacitor C11, and a resistor R42 where it is subjected to envelope detection. The resulting signal is then phase inverted by the phase inversion circuit 52 comprising resistors R43, R44, and R45 and a transistor Q51. Thereafter, it is rectified by the rectifying circuit 53 comprising a transistor Q52 and a capacitor C12, whereby a control voltage is obtained at the output terminal 54.

One example of the constants of the circuit elements in the above described circuit is as follows.

| Resistors: |         |     |          |
|------------|---------|-----|----------|
| R40        | 220 KΩ  | R41 | 22 KΩ    |
| R42        | 100 KΩ  | R43 | 10 KΩ    |
| R44        | 2.2 KΩ  | R45 | 4.7 KΩ   |
| R46        | 1.5 KΩ  |     |          |
| Capacitors: |        |     |          |
| C10        | 0.02 μF | C11 | 1,000 PF |
| C12        | 0.1 μF  |     |          |

A third embodiment of the demodulation system of the invention will now be described with reference to FIG. 10. In this embodiment, the output signal of the equalizer 12 is supplied to the band-pass filter 16, as in the preceding embodiments. Moreover, it is supplied to a harmonics detection circuit 60 for detecting the harmonics component of the direct wave sum signal and accordingly producing a control signal as output. This control signal is used to control the AC lock range of the PLL similarly as in the embodiment illustrated in FIG. 3.

For the harmonics detection circuit 60, a bandpass filter having a pass band of, for example, from 15 to 20 KHz is used. The maximum frequency of the direct wave sum signal is 15 KHz, while the lower limit of the deviation of the angle modulated wave is 20 KHz. For this reason, by filtering a band of from 15 to 20 KHz, it is possible to detect the harmonics component of the direct wave sum signal.

Further, this invention is not limited to these embodiments, but various variations and modifications may be made without departing from the scope and spirit of the invention.

What is claimed is:

1. A system for demodulating an angle modulated wave signal which is included in a multiplex of signals reproduced from a multichannel record disc on which the multiplex of an angle modulated wave signal and a direct wave signal are recorded, said system comprising:

separator means responsive to the reproduced mutliplex of signals for individually separating the angle modulated wave signal and the direct wave signal from the reproduced multiplex of signals;

phase locked loop means comprising voltage controlled oscillator means; phase comparator means for generating an output signal representing a phase difference detected responsive to a comparison of the phase of the carrier wave of the separated angle modulated wave signal with the phase of a signal generated by said voltage controlled oscillator means; variable attenuation means responsive to the output signal of said phase comparator means foor variably attenuating audio frequency components in the output signal of said phase comparator means more than frequency components in the output signal which have frequencies that are lower than the audio frequencies so that the attenuation quantity of the audio frequency components is varied corresponding to an attenuation control signal applied thereto, the output signal of said variable attenuation means being a demodulation of the angle modulated wave signal; said voltage controlled oscillator means changing the frequency responsive to a part of the output signal of said variable attenuation means of the generated signal to follow the frequency of the carrier wave;

whereby said phase locked loop means has a first lock range within which the oscillation frequency of said voltage controlled oscillator means follows the frequency deviations of the carrier wave which are lower than the audio frequencies and a second lock range which is narrower than the first lock range and within which the oscillation frequency of said voltage controlled oscillator means follows the audio frequency deviations of the carrier wave and which second lock range is varied corresponding to the attenuation control signal;

detecting means responsive to the angle modulated wave signal separated by said separator means for detecting the envelope of the separated angle modulated wave signal to produce an output signal;

phase-inverting means responsive to the output signal of said detecting means for producing a phase-inverted output signal; and rectifier means for rectifying the phase-inverted output signal to provide said control signal;

said variable attenuation means being responsive to the control signal from said rectifier means for varying the attenuation quantity of the audio frequency components corresponding to the level of the output signal of said rectifier means.

2. A system for demodulating an angle modulated wave signal as set forth in claim 1 further comprising limiter means coupled between said variable attenuation means and said voltage controlled oscillator means for limiting at a predetermined level the amplitude of the output signal of said variable attenuation means, said voltage controlled oscillator means being responsive to a part of the output signal of said limiter means instead of the output signal of said variable attenuation means for changing the frequency of the generated signal, whereby the lower frequency limits of the first and second lock ranges are higher than the frequencies of the direct wave signal.

3. A system for demodulating an angle modulated wave signal which is included in a multiplex of signals reproduced from a multichannel record disc on which the multiplex of signals comprising the angle modulated wave signal and a direct wave signal are recorded, said system comprising separator means responsive to the reproduced multiplex of signals for individually separating the angle modulated wave signal and the direct wave signal from the reproduced multiplex of signals;

phase locked loop means comprising voltage controlled oscillator means; phase comparator means for generating an output signal responsive to a comparison of the phase of the carrier wave of the angle modulated wave signal separated by said separator means with the phase of an oscillation signal generated by said voltage controlled oscillator means, said output signal corresponding to the phase difference; variable attenuation means responsive to the output signal of said phase comparator means for variably attenuating audio frequency components in the output signal of said phase comparator means more than frequency components in the output signal which have frequencies that are lower than the audio frequencies so that the attenuation quantity of the audio frequency components is varied corresponding to an attenuation control signal applied thereto, the output signal of said variable attenuation means being a demodulation of the angle modulated wave signal; said voltage controlled oscillator means being responsive to a part of the output signal of said variable attenuation means for changing the frequency of the oscillation signal to follow the frequency of the carrier wave;

whereby said phase locked loop means has a first lock range within which the oscillation frequency of said voltage controlled oscillator means follows the frequency deviations of the carrier wave which are lower than the audio frequencies and has a second lock range which is narrower than the first lock range and within which the oscillation frequency of said voltage controlled oscillator means follows the audio frequency deviations of the carrier wave, said second lock range being varied corresponding to the attenuation control signal; and harmonics detection circuit means having a frequency pass band, the lower limit of which is higher than the frequencies of the direct wave signal and the upper limit of which is lower than the frequencies of the angle modulated wave signal, said harmonics detection circuit means passing the higher harmonic components of the direct wave signal responsive to the reproduced multiplex of signals for producing an output signal;

said variable attenuation means being responsive to the output signal of said harmonics detection circuit means as the attenuation control signal for varying the attenuation quantity of the audio frequency components corresponding to the level of the output signal of said harmonics detection circuit means.

4. A system for demodulating an angle modulated wave signal as set forth in claim 3 further comprising limiter means coupled between said variable attenuation means and said voltage controlled oscillator means for limiting at a predetermined level the amplitude of the output signal of said variable attenuation means, said voltage controlled oscillator means being responsive to a part of the output signal of said limiter means instead of the output signal of said variable attenuation means for changing the oscillation frequency, whereby the lower frequency limits of the first and second lock ranges are higher than the frequencies of the direct wave signal.

* * * * *